(12) United States Patent
Chen

(10) Patent No.: US 7,554,789 B2
(45) Date of Patent: Jun. 30, 2009

(54) CAPACITOR ARRAY MANAGEMENT

(75) Inventor: Hung-I Chen, Kaohsiung (TW)

(73) Assignee: Mediatek Inc., Hsin-Chu (TW)

( * ) Notice: Subject to any disclaimer, the term of this patent is extended or adjusted under 35 U.S.C. 154(b) by 257 days.

(21) Appl. No.: 11/427,387

(22) Filed: Jun. 29, 2006

(65) Prior Publication Data

US 2008/0002332 A1  Jan. 3, 2008

(51) Int. Cl.
*H01G 4/38* (2006.01)
*H02M 3/06* (2006.01)

(52) U.S. Cl. .................. 361/328; 361/330; 307/109

(58) Field of Classification Search ............. 361/328, 361/329
See application file for complete search history.

(56) References Cited

U.S. PATENT DOCUMENTS

| 5,952,952 A | | 9/1999 | Choi et al. | |
|---|---|---|---|---|
| 5,966,047 A | * | 10/1999 | Anderson et al. | 327/565 |
| 5,973,633 A | | 10/1999 | Hester | |
| 5,998,275 A | * | 12/1999 | Richiuso | 438/381 |
| 6,016,019 A | | 1/2000 | Wojewoda | |
| 6,124,821 A | * | 9/2000 | Pezzini et al. | 341/161 |
| 6,614,645 B1 | | 9/2003 | Sakurai et al. | |
| 6,982,454 B2 | * | 1/2006 | Giuroiu et al. | 257/306 |
| 7,126,206 B2 | * | 10/2006 | Piasecki | 257/532 |
| 2002/0089813 A1 | * | 7/2002 | Yamamoto et al. | 361/328 |

FOREIGN PATENT DOCUMENTS

JP  09027732 A  *  1/1997

OTHER PUBLICATIONS

Shi et al, Data Converters for wireless standards, 2002, Kluwer Academic Publishers, p. 91-102.*

* cited by examiner

*Primary Examiner*—Eric Thomas
*Assistant Examiner*—David M Sinclair
(74) *Attorney, Agent, or Firm*—Thomas, Kayden, Horstemeyer & Risley

(57) ABSTRACT

A capacitor array comprising a plurality of unit capacitors, each having first and second electrode plates. The first electrode plates are commonly connected via first routings. The second electrode plates are grouped and connected to a plurality of nodes via second routings. The second routings connected to one node and another do not overlap in the capacitor array. The second electrode plates connected to the same node conglomerate as a group and no second electrode plate connected to another node is located in the group.

18 Claims, 11 Drawing Sheets

FIG. 3

CAPACITOR ARRAY MANAGEMENT

BACKGROUND OF THE INVENTION

1. Field of the Invention

The invention relates to capacitor arrays and, in particular, to a capacitor array layout technique which improves capacitor matching.

2. Description of the Related Art

A successive approximation analog-to-digital (A/D) converter uses a binary weighted capacitor array. For a binary search algorithm, the ideal size of these capacitors obeys the following ratios. The smallest capacitor has a single unit capacitance, the capacitance of the next one is two units, four units, eight units and up to $2^{n-1}$, wherein n is the bit resolution of the A/D converter. This requires a capacitance of 1024 units for a 10-bit A/D with the largest capacitor having 512 units.

To improve matching, capacitor array layout requires special attention. The capacitor array needs to be laid out so as to avoid process variations. FIG. 1 shows a conventional capacitor array layout. The capacitor array is laid out as a set of concentric capacitors with increasing radii based on the size of the capacitor. Good matching can be achieved since the symmetrical layout reduces the systematic mismatch by canceling the first order degradation. However, the routing of the inner capacitors induces significant parasitic capacitance. Since the parasitic capacitance associated with each binary-weighted capacitor is not in a binary-weighted relation, matching between the capacitors is thus degraded.

In many applications of binary-weighted capacitor array such as capacitor digital to analog converter (C-ADC), top plates of every capacitor are commonly connected, as shown in FIG. 2. If the parasitic capacitances induced by the routings associated with nodes MSB, MSB−1, . . . , LSB+1, and LSB are not in a binary-weighted relation, integral nonlinearity (INL) and differential nonlinearity (DNL) of a transfer curve of the digital to analog converter could be significant and may have a great impact on high resolution applications.

BRIEF SUMMARY OF THE INVENTION

An embodiment of a capacitor array comprises a plurality of unit capacitors, each having first and second electrode plates. The first electrode plates are connected via first routings. The second electrode plates are grouped and connected to a plurality of nodes via second routings. The second routings do not overlap one another in the capacitor array. The second electrode plates connected to the same node conglomerate together as a group and no second electrode plate connected to another node is located in the group.

The invention provides a capacitor array arrangement. The capacitor array arrangement minimizes parasitic capacitance induced by routings of the capacitor array such that binary-weighted relation between sub-capacitors in the capacitor array is more accurately accomplished. The capacitor array arrangement also minimizes systematic or random mismatches A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 3 is a schematic diagram of a capacitor array;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
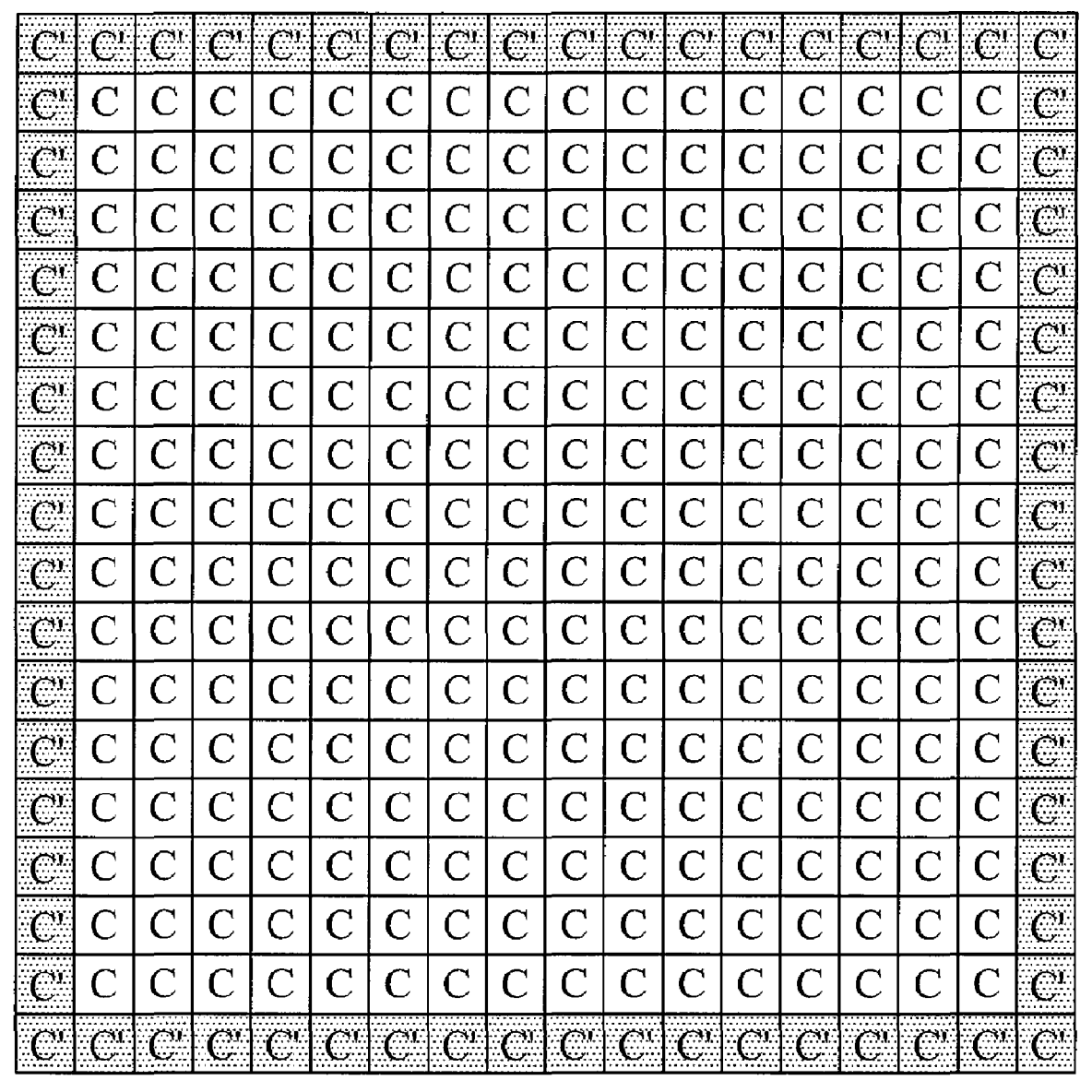

FIG. 3 is a schematic diagram of a capacitor array. To achieve better matching, each sub-capacitor of a binary-weighted capacitor is formed with unit capacitors C connected in parallel. In addition, the binary-weighted capacitor is uniformly surrounded by dummy capacitors, shown as shadowed unit capacitors C' in FIG. 3, such that the unit capacitors are uniformly formed during semiconductor fabrication.

Figure 1:
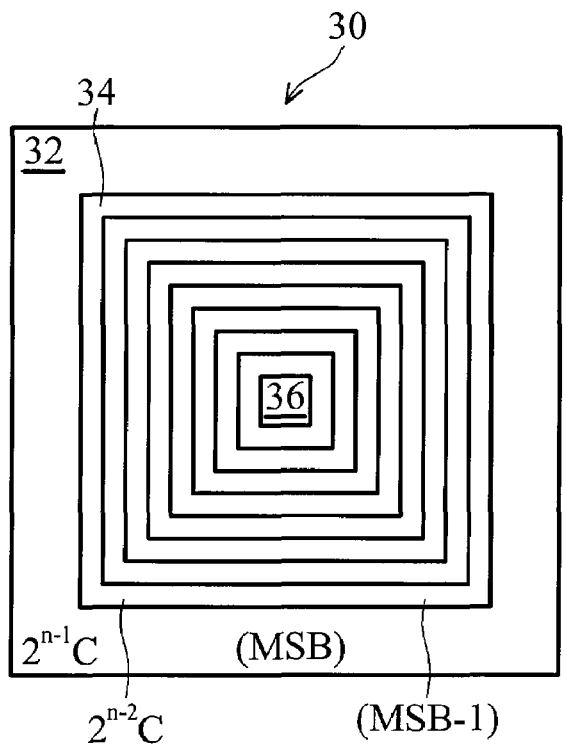
FIG. 1 shows a layout of a conventional capacitor array.
Figure 2:
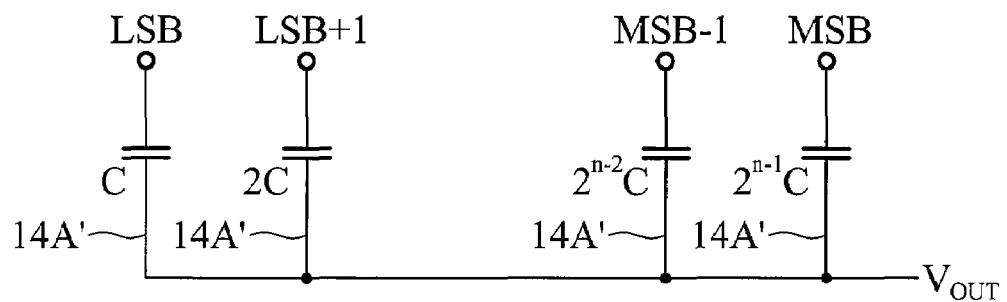
FIG. 2 is a circuit diagram of a capacitor digital to analog converter (C-DAC)
Figure 4:
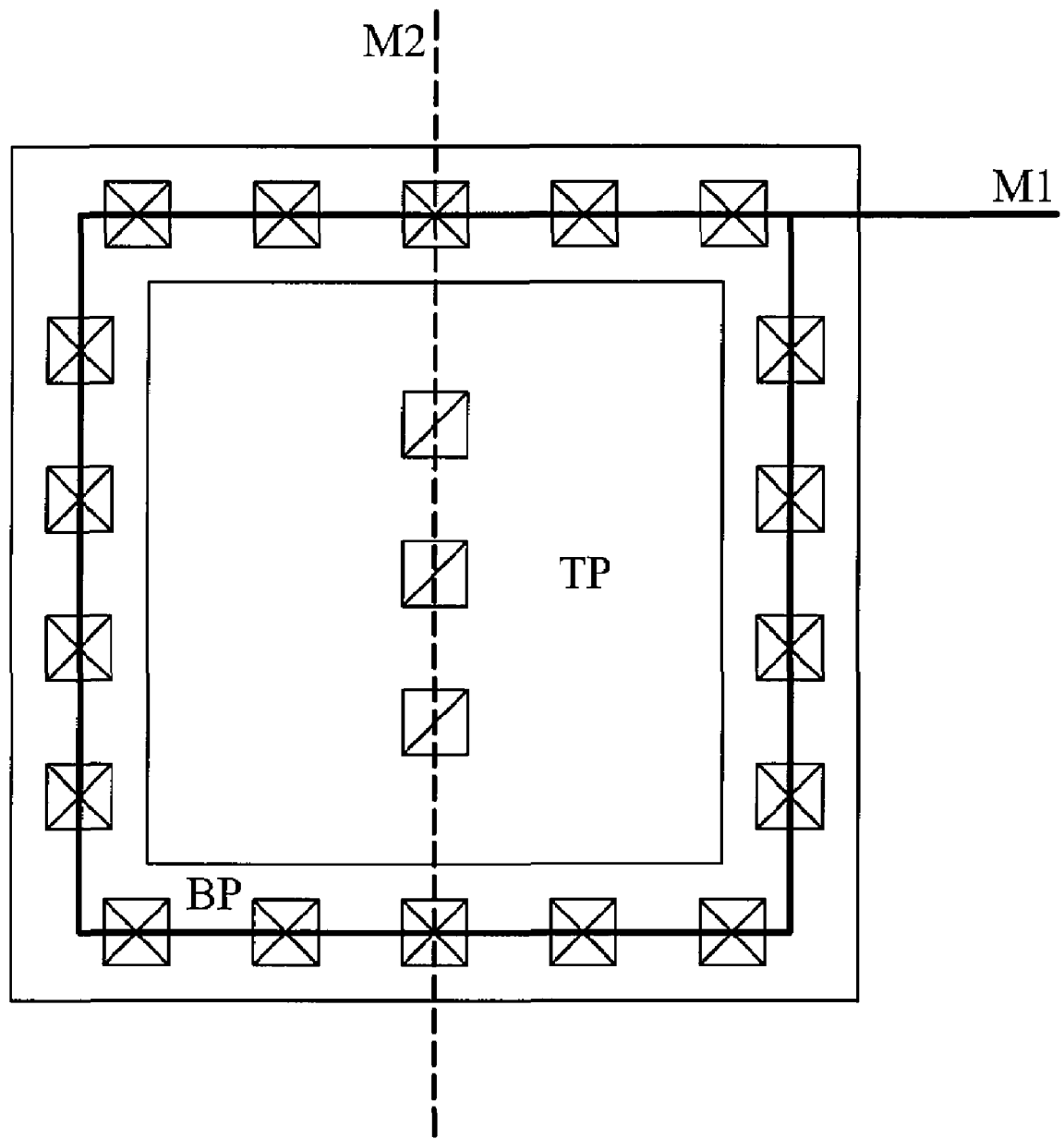
FIG. 4 shows a layout of the unit capacitor C in FIG. 3.

FIG. 4 is a layout of the unit capacitor C in FIG. 3. In FIG. 4, a metal layer M1 is used for routing of a bottom electrode plate BP of the unit capacitor C and another metal layer M2 for routing of a top electrode plate TP. A pair of overlaps between the metal layers M1 and M2 induces parasitic capacitance. In addition, the overlaps between the metal layer M2 and the bottom electrode plate BP also induce parasitic capacitance. Additionally, in an application as shown in FIG. 2, the top electrode plates TP of the sub-capacitors are connected to the same node. Thus, routings of the metal layer M2 are connected in series vertically.

Figure 5:
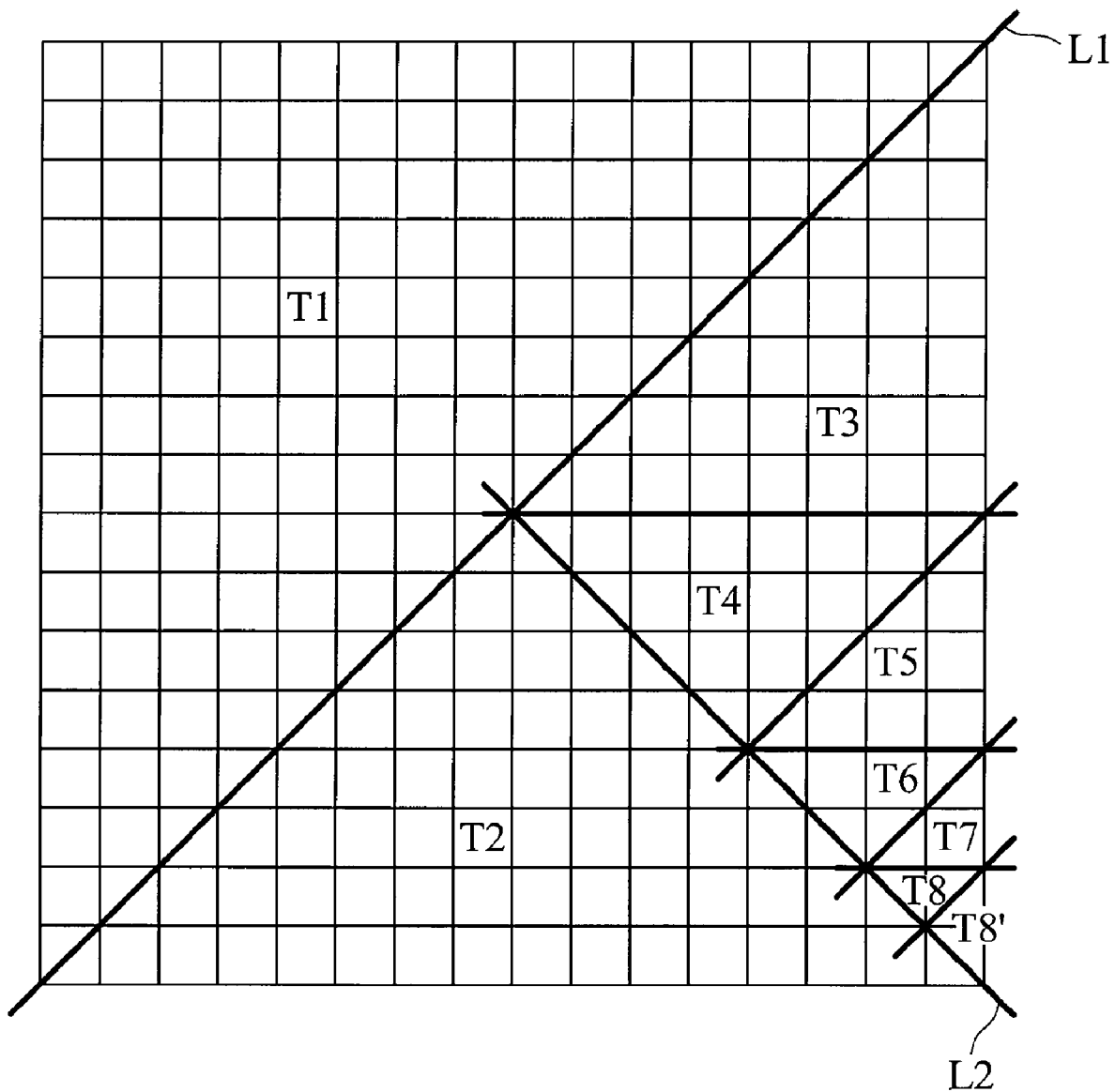
FIG. 5 is a schematic diagram demonstrating a concept of an embodiment of the capacitor array grouped into binary-weighted sub-capacitors.

FIG. 5 is a schematic diagram demonstrating a concept of an exemplary capacitor array grouped into binary-weighted sub-capacitors. As shown in FIG. 5, the capacitor array is square. A thick line L1 along a diagonal of the square divides the capacitor array into two equivalent triangles. Another thick line L2 divides one of the triangles into two smaller equivalent triangles, and so forth. In such way, area of the triangles T1~T7, T8 and T8' in the capacitor array is in a binary-weighted relation. Since the capacitor array cannot be physically divided along a diagonal thereof, the arrangement is slightly modified and an actual capacitor array arrangement is shown in FIG. 6.

Figure 6:
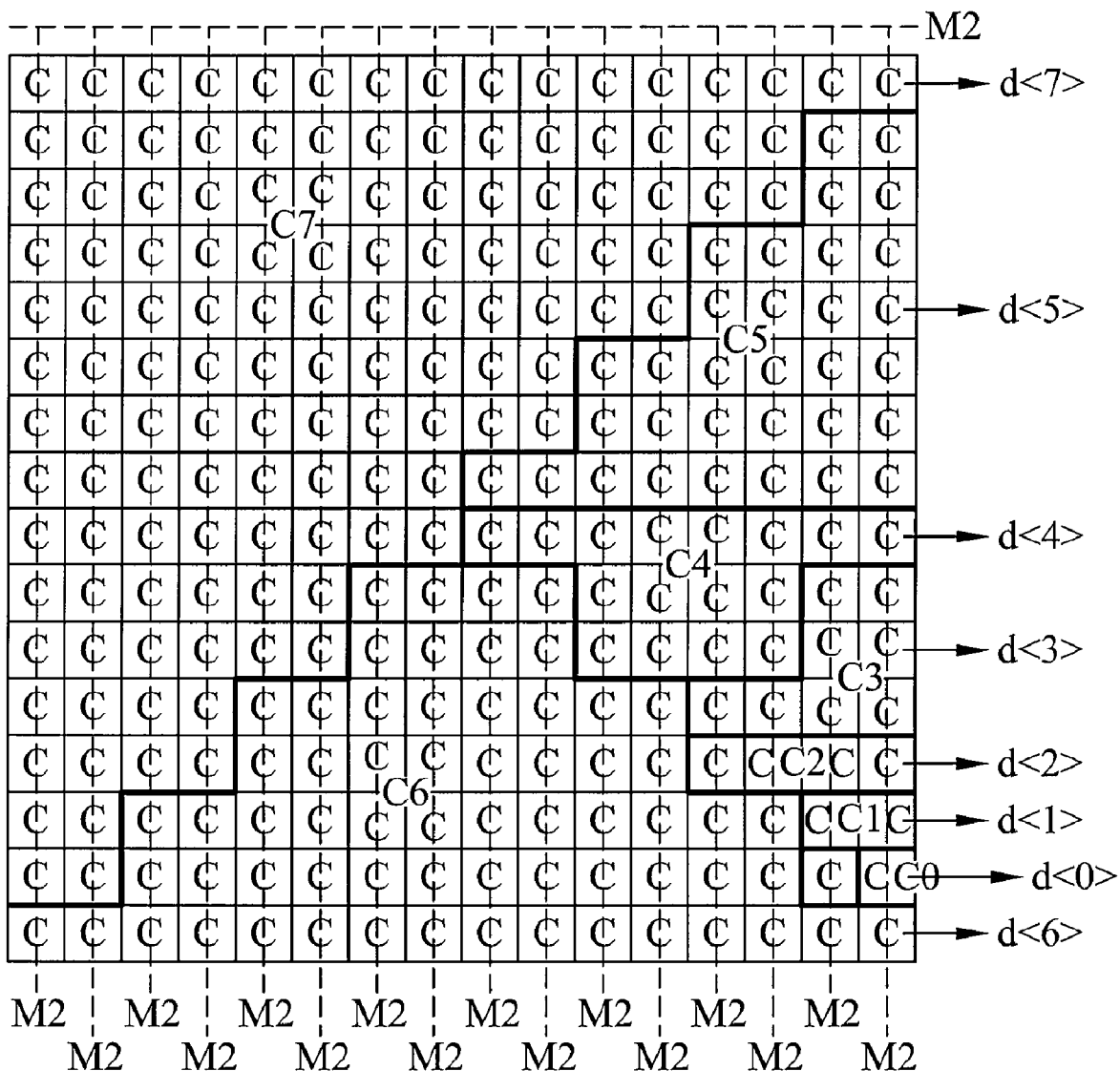
FIG. 6 is a schematic diagram of capacitor array arrangement of a binary-weighted capacitor according to an embodiment of the invention.

FIG. 6 is a schematic diagram of capacitor array arrangement of a binary-weighted capacitor according to an embodiment of the invention. In FIG. 6, top electrode plates of the unit capacitors C in each column are connected with a metal layer M2. The bottom electrode plates are grouped and routed according to thick lines as shown in FIG. 5. One half of the unit capacitors C are grouped as a sub-capacitor C7, where the sub-capacitor C7 has a sawtooth-shaped edge along a diagonal of the capacitor array. One half of the unit capacitors C from the other half are grouped as a sub-capacitor C6, and so forth. In such way, the routings of the bottom electrodes are respectively routed to a corresponding node d<7:0> without overlapping in the capacitor array. Each of the nodes d<7:0> respectively receives a corresponding bit of a binary signal. As a result, parasitic capacitance associated with each binary-weighted sub-capacitor C0~C7 is still in a binary-weighted relation such that transfer function of a C-DAC is provided with good linearity.

Figure 7:
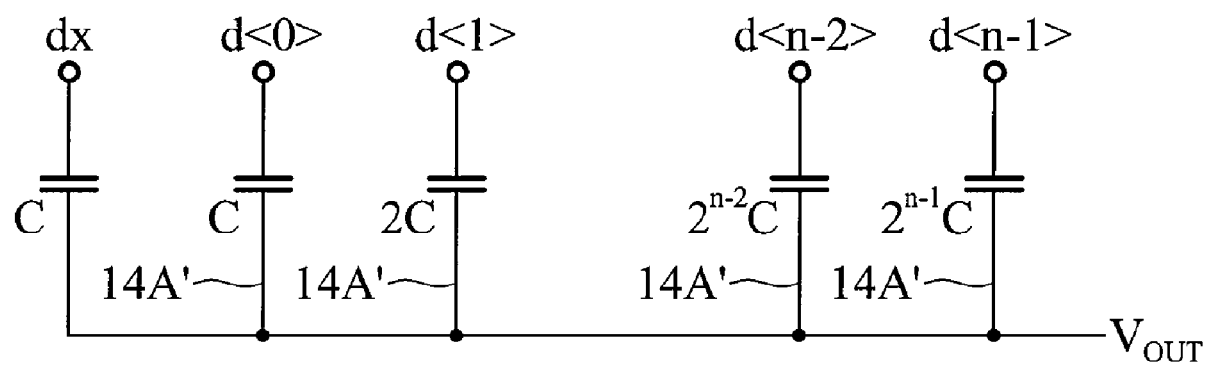
FIG. 7 is a circuit diagram of a C-DAC including two single unit capacitors.
Figure 8:
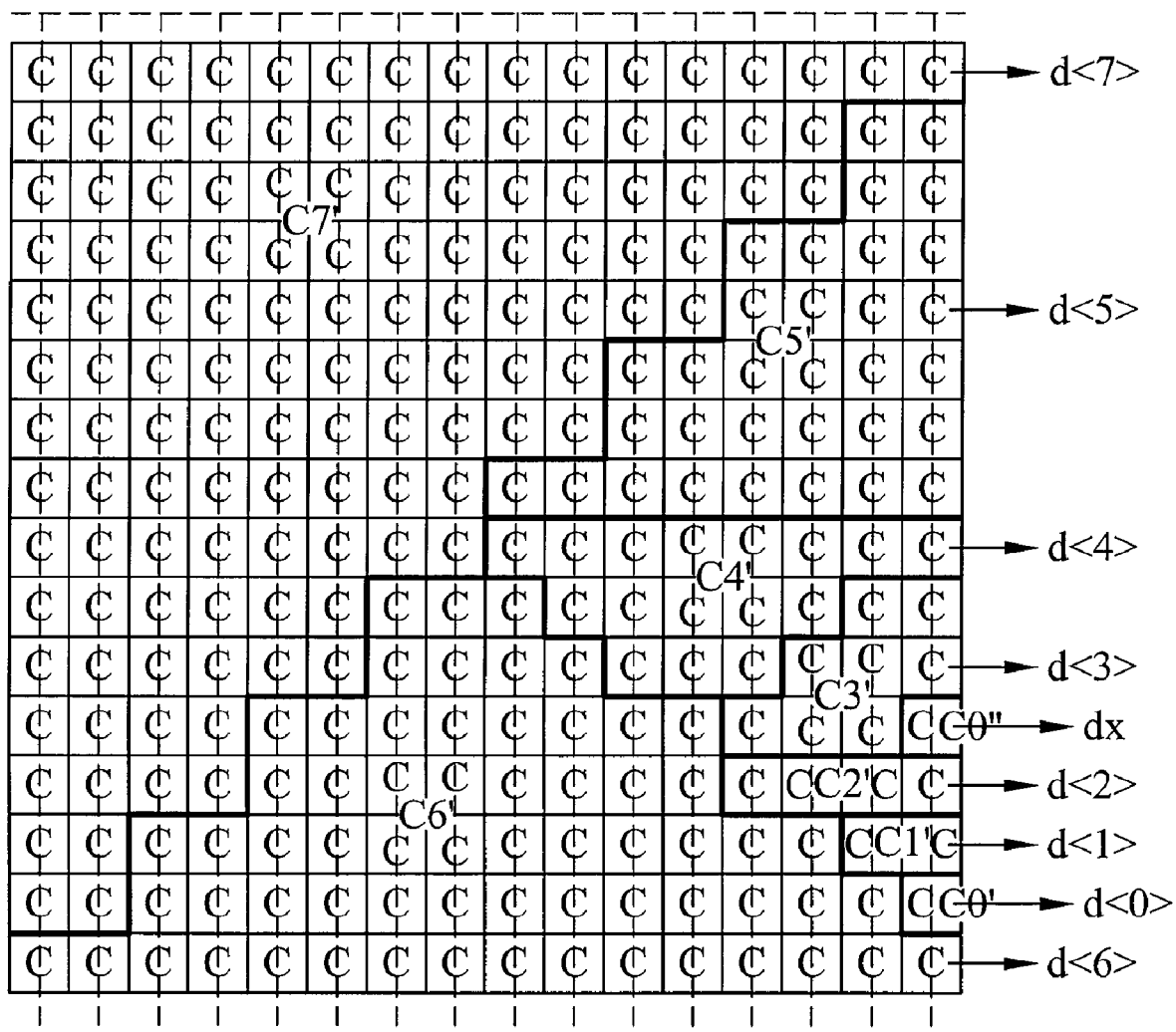
FIG. 8 is a schematic diagram of routings of a binary-weighted capacitor array according to the circuit diagram in FIG. 7.

FIG. 7 is a circuit diagram of a C-DAC including two single unit capacitors and FIG. 8 is a schematic diagram of routings of a binary-weighted capacitor array according to the circuit diagram in FIG. 7. The arrangement in FIG. 6, slightly modified, is shown as the arrangement in FIG. 8. Via such modification, one isolated unit capacitor C near a right bottom corner of the capacitor array in the original arrangement is merged into the sub-capacitor C6' and one unit capacitor C in the original sub-capacitor C6 is merged into the sub-capacitor C4', and so forth. As a result, the sub-capacitors C0'~C7' are in a binary-weighted relation. In addition, there is a sub-capacitor C0", composed of a single unit capacitor, routed out via the routing dx. In FIG. 8, the routings d<7:0> and dx are routed out of the capacitor array without overlapping in the capacitor array. As a result, parasitic capacitance associated with each binary-weighted sub-capacitor is still in a binary-weighted relation.

Figure 10A:
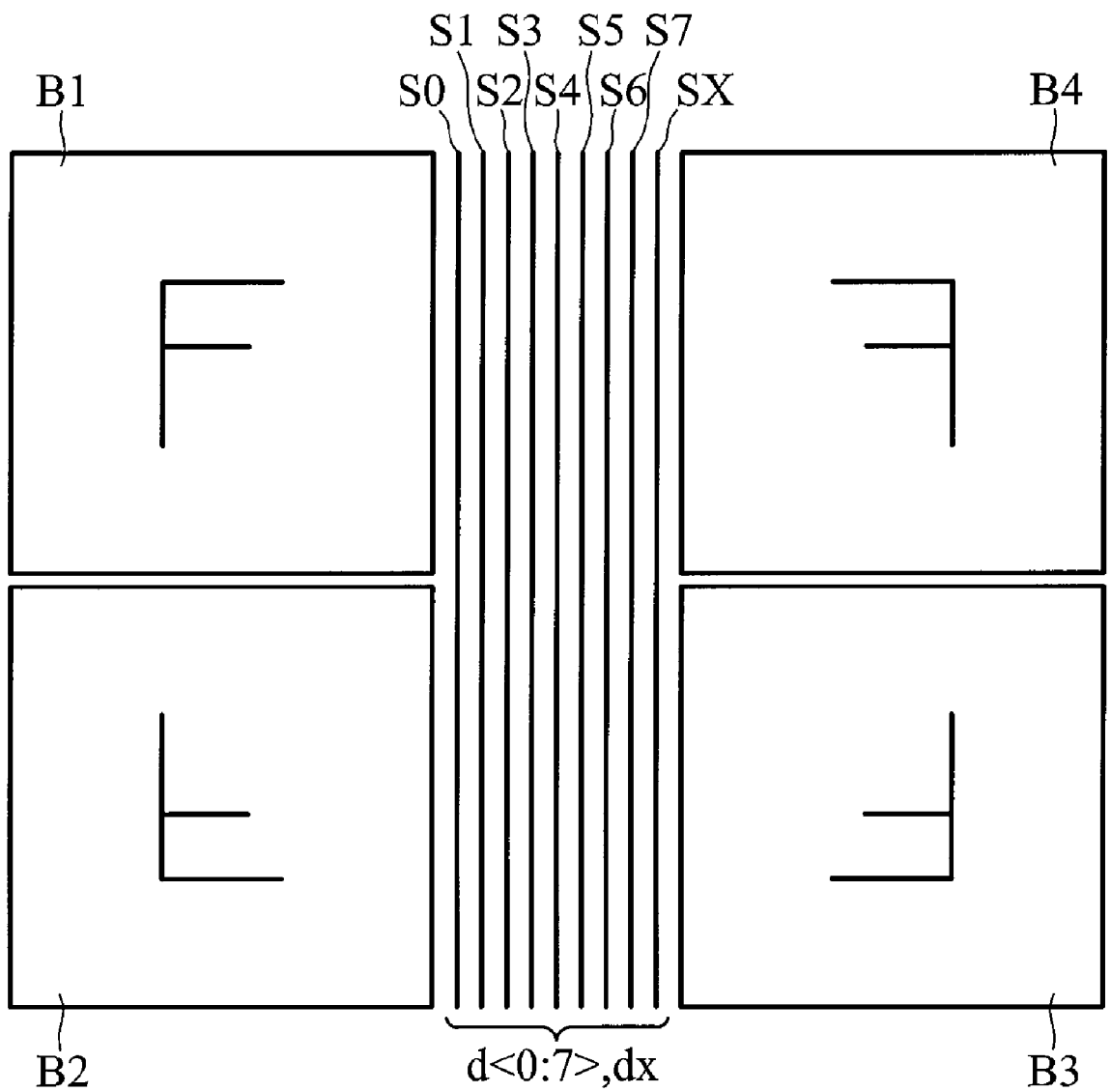
FIG. 10A shows a symmetrical capacitor layout for cancellation of systematic mismatch according to an embodiment of the invention.

FIG. 10A shows a symmetrical capacitor layout for cancellation of systematic mismatch according to an embodiment of the invention. The capacitor array in FIG. 6 or FIG. 8 is shown as a block marked with a letter "F" in FIGS. 10A and 10B. There are four blocks B1~B4 in FIGS. 10A and 10B. The blocks B2 and B4 are respectively a mirror image of the block B1 in vertical and horizontal dimensions and the block B3 a mirror image of both blocks B2 and B4. Via such symmetrical arrangement, systematic mismatch in each block can be cancelled by other symmetrical blocks. In FIG. 10A, signal rails S0~S7 and SX are respectively associated with one of the nodes d<0:7> and dx, between the blocks B1/B2 and B3/B4. Since the sub-capacitors in the capacitor array in FIG. 6 or FIG. 8 are routed out from the same side of the capacitor array, it is simple to design routings. The routings of the bottom electrode plates of the sub-capacitors of the same scale, C7 or C7' for example, in the blocks B1~B4 are tied to a corresponding signal rail S7 associated with a corresponding node d<7>. It is noted that if the signal rails are formed with the same conducting layer, the signal rails are formed with a conducting layer other than the layer for the routings of the bottom electrode plates.

Figure 9:
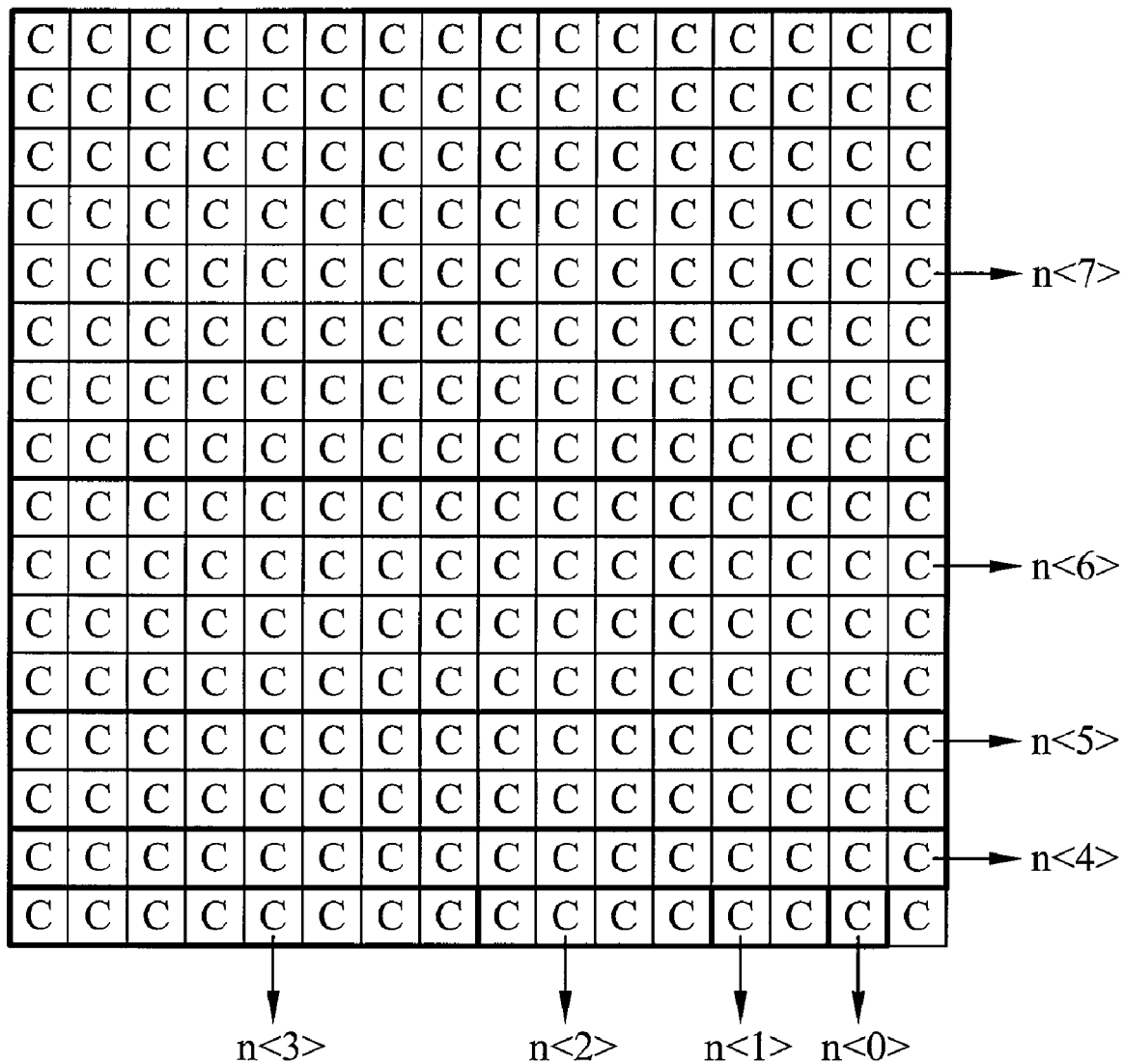
FIG. 9 is a schematic diagram of capacitor array arrangement of a binary-weighted capacitor according to another embodiment of the invention.

FIG. 9 is a schematic diagram of capacitor array arrangement of a binary-weighted capacitor according to another embodiment of the invention. The capacitor array comprising a plurality of unit capacitors C (as shown in FIG. 4). Each unit capacitor C has top and bottom electrode plates (TP and BP in FIG. 4). The top electrode plates are commonly connected via first routings (M2 in FIG. 4). The bottom electrode plates are grouped and connected to a plurality of nodes n<7:0> via second routings (M1 in FIG. 4). The second routings (M1 in FIG. 4) connected to one node and another do not overlap one another in the capacitor array. The bottom electrode plates connected to the same node conglomerate together as a group and no bottom electrode plate connected to another node is located in the group. In other words, a sub-conductor does not intersect or intrude in another sub-conductor in the capacitor array.

Figure 10B:
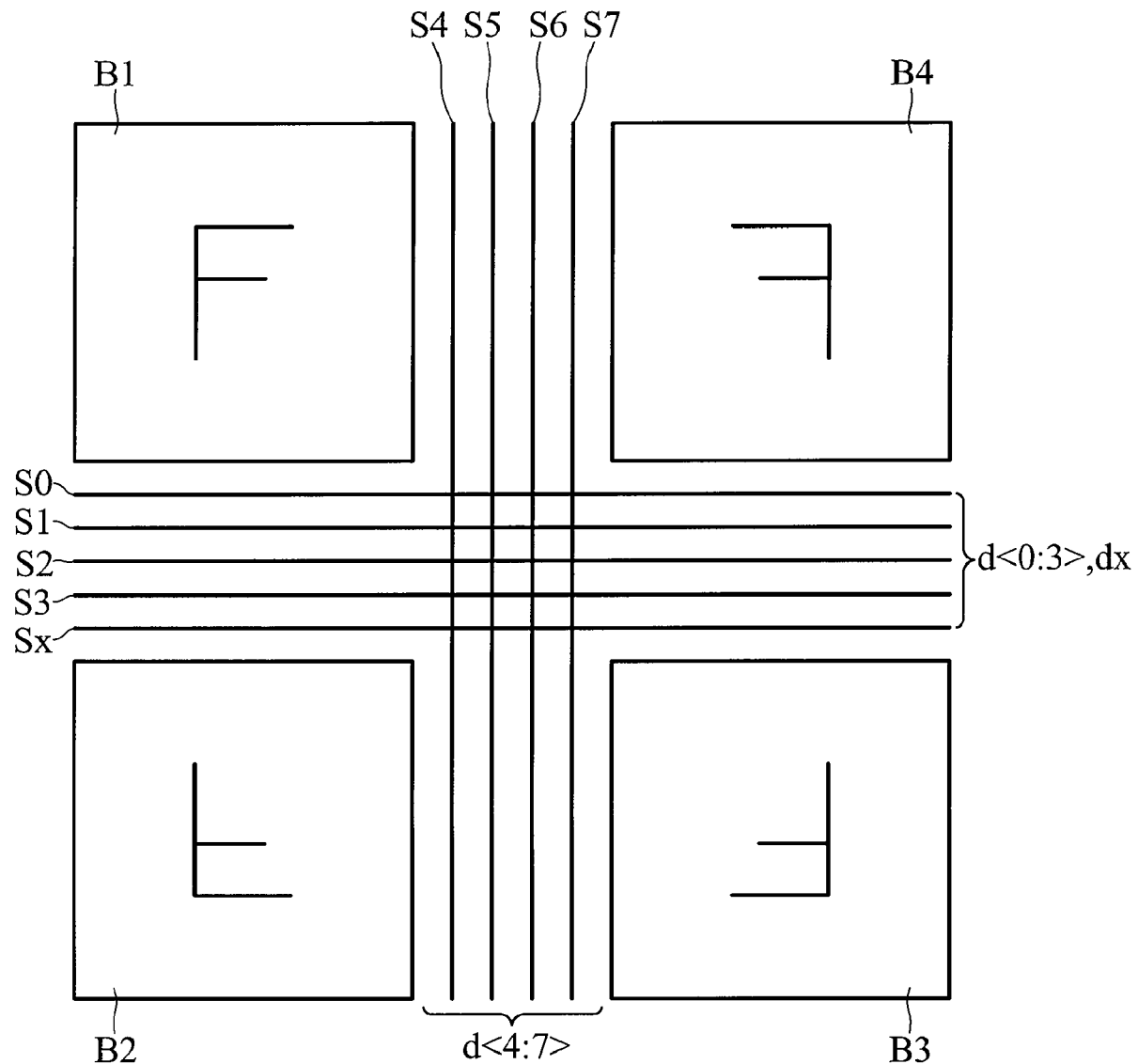
FIG. 10B shows a symmetrical capacitor layout for cancellation of systematic mismatch according to another embodiment of the invention.

FIG. 10B shows a symmetrical capacitor layout for cancellation of systematic mismatch according to another embodiment of the invention. The capacitor array in FIG. 9 is shown as a block marked with a letter "F" in FIG. 10B. There are four blocks B1~B4 in FIG. 10B. The blocks B2 and B4 are respectively a mirror image of the block B1 in vertical and horizontal dimensions and the block B3 is a mirror image of both the blocks B2 and B4. Via such symmetrical arrangement, systematic mismatch in each block can be cancelled by other symmetrical blocks. In FIG. 10B, signal rails S4~S7 are respectively associated with one of the nodes d<4:7> between the blocks B1/B2 and B3/B4, and signal rails S0~S3 and SX respectively associated with the one of the nodes d<0:3> and dx between the blocks B1/B4 and B2/B3. Since the sub-capacitors in the capacitor arrays in FIG. 9 are routed out from two sides of each capacitor array, it is simple to design routings. The routings of the bottom electrode plates of the sub-capacitors in the blocks B1~B4 are tied to a corresponding signal rail associated with a corresponding node. For example, the sub-capacitors C7 in the blocks B1~B4 can be tied to the signal rail S7 associated with the node d<7>. It is noted that if the signal rails S4~S7 are formed with one conducting layer and the signal rails S0~S3 and SX with another conducting layer, the signal rails are formed with conducting layers other than the layer for the routings of the bottom electrode plates.

While a C-DAC of 8-bit resolution is used as an example in the disclosure, the scope of the invention is not limited thereto. Those skilled in the art can make modifications or similar arrangements according to their needs, 10-bit resolution for example.

Figure 11:
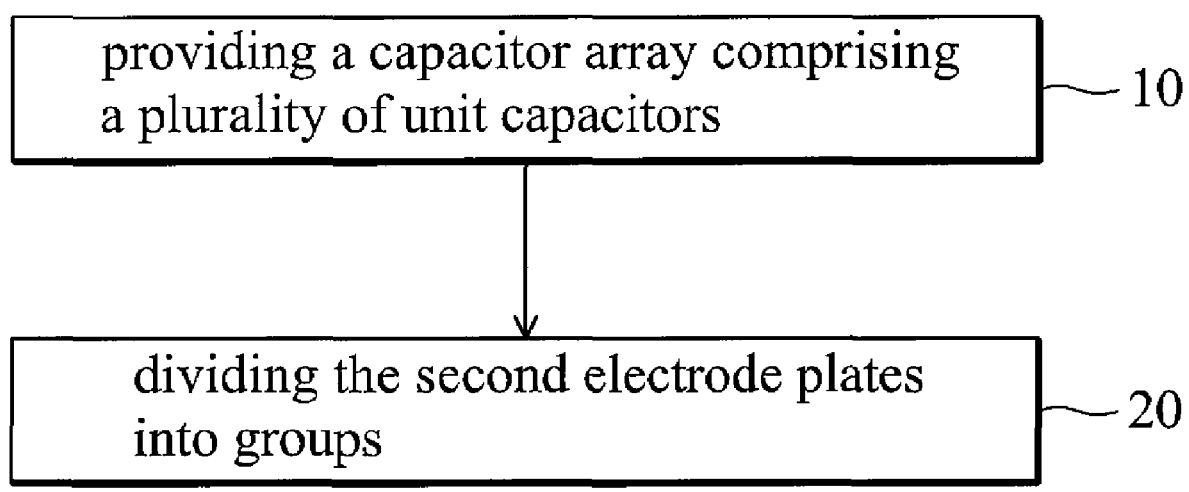
FIG. 11 is a flowchart of a capacitor array layout technique according to an embodiment of the invention.

FIG. 11 is a flowchart of a capacitor array layout technique according to an embodiment of the invention. The method comprises providing a capacitor array comprising a plurality of unit capacitors (step 10) and dividing the second electrode plates into groups (step 20). Each of the unit capacitors has first and second electrode plates. The first electrode plates are commonly connected via first routings and the second electrode plates are connected to a plurality of nodes via second routings. Each group is associated with one of the nodes. The second routings connected to one node and another do not overlap in the capacitor array. Each of the second electrode plates connected to the same node conglomerate together as a sub-capacitor, and no second electrode plate connected to another node is located in the sub-capacitor. Preferably, dividing the second electrode plates into groups further comprises grouping half of the unit capacitors as a first of the sub-capacitors, grouping half of the unit capacitors from the other half as a second of the sub-capacitors, and so forth. The first of the sub-capacitors has a sawtooth-shaped edge along a diagonal of the capacitor array.

While the invention has been described by way of example and in terms of preferred embodiment, it is to be understood that the invention is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A capacitor comprising identical capacitor arrays arranged symmetrically in a horizontal orientation, and each of the capacitor arrays comprising:
   a plurality of unit capacitors, each having first and second electrode plates;
   wherein the first electrode plates are connected via first routings, and the second electrode plates are grouped and connected to a plurality of nodes via second routings, wherein second routings connected to one node and another do not overlap in the capacitor array, and all of the second electrode plates connected to the same node conglomerate as a sub-capacitor, and no second electrode plate connected to another node is located in the sub-capacitor;
   wherein the second routings of the capacitor arrays are routed out to a plurality of signal rails, respectively associated with one of the nodes, between the capacitor arrays, and the signal rails are formed with a conducting layer other than a conducting layer for the second routings of the second electrode plates.

2. The capacitor as claimed in claim 1, wherein the nodes respectively receive a binary signal.

3. The capacitor as claimed in claim 1, wherein the relationship of capacitance associated with the nodes obeys an exponent of two and differs from node to node.

4. The capacitor as claimed in claim 1, wherein the nodes are arranged on the same side of the capacitor array.

5. The capacitor as claimed in claim 1, wherein half of the unit capacitors are grouped together and have a sawtooth-shaped edge along a diagonal of the capacitor array, half of the unit capacitors from the other half are grouped together, and so forth until a group comprising a single unit cell is formed.

6. The capacitor as claimed in claim 1, further comprising a plurality of dummy capacitors uniformly distributed around the periphery.

7. The capacitor as claimed in claim 1, wherein the first routings are formed with a first metal layer and the second routings a second metal layer.

8. A capacitor comprising identical capacitor arrays arranged symmetrically in a vertical orientation, and each of the capacitor arrays comprising:
   a plurality of unit capacitors, each having first and second electrode plates;
   wherein the first electrode plates are connected via first routings, and the second electrode plates are grouped and connected to a plurality of nodes via second routings, wherein second routings connected to one node and another do not overlap in the capacitor array, and all of the second electrode plates connected to the same node conglomerate as a sub-capacitor, and no second electrode plate connected to another node is located in the sub-capacitor;
   wherein the second routings of the capacitor arrays are routed out to a plurality of signal rails, respectively associated with one of the nodes, between the capacitor arrays; and the signal rails are formed with a conducting layer other than a conducting layer for the second routings of the second electrode plates.

9. The capacitor as claimed in claim 8, wherein the nodes respectively receive a binary signal.

10. The capacitor as claimed in claim 8, wherein the relationship of capacitance associated with the nodes obeys an exponent of two and differs from node to node.

11. The capacitor as claimed in claim 8, wherein the nodes are arranged on the same side of the capacitor array.

12. The capacitor as claimed in claim 8, wherein half of the unit capacitors are grouped together and have a sawtooth-shaped edge along a diagonal of the capacitor array, half of the unit capacitors from the other half are grouped together, and so forth until a group comprising a single unit cell is formed.

13. The capacitor as claimed in claim 8, further comprising a plurality of dummy capacitors uniformly distributed around the periphery.

14. The capacitor as claimed in claim 8, wherein the first routings are formed with a first metal layer and the second routings a second metal layer.

15. A capacitor layout technique, comprising:
   providing a capacitor comprising identical capacitor arrays;
   disposing the capacitor arrays symmetrically in a horizontal orientation; and
   providing a plurality of unit capacitors for each of the capacitor arrays, each of the unit capacitors having first and second electrode plates, wherein the first electrode plates are commonly connected via first routings and the second electrode plates are connected to a plurality of nodes via second routings, and the step of providing the unit capacitors comprising:
      for each of the capacitor arrays, dividing the second electrode plates into groups each associated with one of the nodes such that the second routings connected to one node and another do not overlap in the capacitor array, and all of the second electrode plates connected to the same node conglomerate as a sub-capacitor, and no second electrode plate connected to another node is located in the sub-capacitor; and
   wherein the second routings of the capacitor arrays are routed out to a plurality of signal rails, respectively associated with one of the nodes, between the capacitor arrays; and the signal rails are formed with a conducting layer other than a conducting layer for the second routings of the second electrode plates.

16. The capacitor layout technique as claimed in claim 15, wherein dividing the second electrode plates into groups further comprises grouping half of the unit capacitors as a first group of the sub-capacitors, grouping half of the unit capacitors from the other half as a second group of the sub-capacitors, and repeating such grouping until a group comprising a single unit cell is formed; wherein the first group of the sub-capacitors has a sawtooth-shaped edge along a diagonal of the capacitor array.

17. A capacitor layout technique, comprising:
   providing a capacitor comprising identical capacitor arrays;
   disposing the capacitor arrays symmetrically in a vertical orientation; and
   providing a plurality of unit capacitors for each of the capacitor arrays, each of the unit capacitors having first and second electrode plates, wherein the first electrode plates are commonly connected via first routings and the second electrode plates are connected to a plurality of nodes via second routings, and the step of providing the unit capacitors comprises:
      for each of the capacitor arrays, dividing the second electrode plates into groups each associated with one of the nodes such that the second routings connected to one node and another do not overlap in the capacitor array, and all of the second electrode plates connected to the same node conglomerate as a sub-capacitor, and no second electrode plate connected to another node is located in the sub-capacitor; and wherein the second routings of the capacitor arrays are routed out to a plurality of signal rails, respectively associated with one of the nodes, between the capacitor arrays; and the signal rails are formed with a conducting layer other than a conducting layer for the second routings of the second electrode plates.

18. The capacitor layout technique as claimed in claim 17, wherein dividing the second electrode plates into groups further comprises grouping half of the unit capacitors as a first group of the sub-capacitors, grouping half of the unit capacitors from the other half as a second group of the sub-capacitors, and so forth until a group comprising a single unit cell is formed; wherein the first group of the sub-capacitors has a sawtooth-shaped edge along a diagonal of the capacitor array.

* * * * *